(12) United States Patent
Ramanadin

(10) Patent No.: US 7,016,988 B2
(45) Date of Patent: Mar. 21, 2006

(54) OUTPUT BUFFER REGISTER, ELECTRONIC CIRCUIT AND METHOD FOR DELIVERING SIGNALS USING SAME

(75) Inventor: Bernard Ramanadin, Crolles (FR)

(73) Assignee: STMicroelectronics, S.A., Montrouge (FR)

( * ) Notice: Subject to any disclaimer, the term of this patent is extended or adjusted under 35 U.S.C. 154(b) by 266 days.

(21) Appl. No.: 10/701,115

(22) Filed: Nov. 4, 2003

(65) Prior Publication Data

US 2004/0174752 A1    Sep. 9, 2004

(30) Foreign Application Priority Data

Nov. 4, 2002  (FR) .................................. 02 13755

(51) Int. Cl.
*G06F 3/00* (2006.01)
*G11C 7/00* (2006.01)
*G11C 8/00* (2006.01)

(52) U.S. Cl. ............................. 710/29; 710/51; 710/58; 365/189.02; 365/189.05; 365/230.02

(58) Field of Classification Search ........... 365/189.02, 365/189.05, 154, 205, 230.02; 710/5, 36, 710/29, 51, 52, 58, 62
See application file for complete search history.

(56) References Cited

U.S. PATENT DOCUMENTS

| | | | | |
|---|---|---|---|---|
| 5,416,749 A | * | 5/1995 | Lai | ........................ 365/230.02 |
| 5,499,382 A | | 3/1996 | Nusinov et al. | |
| 5,673,397 A | * | 9/1997 | Ferguson et al. | ............... 710/5 |
| 5,768,624 A | * | 6/1998 | Ghosh | ........................ 710/53 |
| 6,091,664 A | * | 7/2000 | Ramanadin | ............ 365/189.08 |
| 6,182,256 B1 | * | 1/2001 | Qureshi | ...................... 714/726 |
| 6,760,392 B1 | * | 7/2004 | Tan et al. | ................... 375/354 |
| 2002/0175704 A1 | * | 11/2002 | Young et al. | ................. 326/46 |

FOREIGN PATENT DOCUMENTS

| | | |
|---|---|---|
| EP | 0 177 280 | 4/1986 |
| JP | 63132562 | 6/1988 |
| JP | 08201487 | 8/1996 |

OTHER PUBLICATIONS

French Preliminary Search Report dated Jul. 29, 2003 for French Application No. 0213755.

* cited by examiner

*Primary Examiner*—Dov Popovici
*Assistant Examiner*—Joshua D Schneider
(74) *Attorney, Agent, or Firm*—Lisa K. Jorgenson; Jose Gutman; Fleit, Kain, Gibbons, Gutman, Bongini & Bianco, P.L.

(57) ABSTRACT

An output buffer register includes a first input flip-flop register receiving a given number N of input signals, a latching register, a selection register, and an output multiplexer delivering N output signals. Only one data input of the enable register receives an enable signal. In this way, the propagation time at the input of the buffer register is reduced.

12 Claims, 1 Drawing Sheet

OUTPUT BUFFER REGISTER, ELECTRONIC CIRCUIT AND METHOD FOR DELIVERING SIGNALS USING SAME

CROSS-REFERENCE TO RELATED APPLICATION

This application is based upon and claims priority from prior French Patent Application No. 02 13755, filed on Nov. 4, 2002, the entire disclosure of which is herein incorporated by reference.

BACKGROUND OF THE INVENTION

1. Field of the Invention

The present invention pertains to an output buffer register, and finds applications, in particular, in electronic systems comprising a system bus and functional modules linked to the system bus by way of appropriate communication ports, in particular microprocessors.

2. Description of the Related Art

An output buffer register is a circuit which is intended to be arranged at the output of a functional module, upstream of a communication port of master type which links it to the bus. Its function is to deliver output signals of the functional module.

According to a known design rule applied by the person of ordinary skill in the art, all of the output signals can be delivered on the respective data outputs of flip-flops. This makes it possible to limit the latency introduced at the output.

The micro-architecture of a known output buffer register, in accordance with the diagram of FIG. 1, complies with this design rule.

The output buffer register comprises a single flip-flop register 436 or input register, and an input multiplexer 435.

The register 436 comprises a given number N of flip-flops, each having a data input, a data output and an enable input. The multiplexer 435 comprises N first inputs 435a, N second inputs 435b, N outputs 435c and a selection input 435d.

The N inputs 435a of the multiplexer respectively receive the N input signals data_in. The N outputs 435c of the multiplexer are respectively linked to the N data inputs of the register 436. The N data outputs 436b of the respective flip-flops of the register 436 deliver N output signals data_out, respectively. These N output signals are moreover delivered on the N inputs 435b of the multiplexer 435.

The N enable inputs 436c of the respective flip-flops of the register 436 receive a clock signal CLK. Moreover, an update_data signal is received on the selection input 435d of the multiplexer 435. This signal is an enable signal which is for example delivered by a state machine.

The register 436 in combination with the multiplexer 435 makes it possible to latch the values of the output signals when the update_data signal is at 0.

This prior art complies with the aforesaid design rule, since the output signals are delivered by data outputs of flip-flops.

On the other hand, the update_data signal drives N enable inputs, namely the inputs 435d of the N flip-flops of the multiplexer 435. This often requires the introduction of what is referred to as a "buffer tree", which increases the intricacy of the micro-structure and introduces some latency at the input of the buffer register.

Accordingly, there exists a need for overcoming the disadvantages of the prior art as discussed above.

SUMMARY OF THE INVENTION

The invention aims to remedy this drawback of the prior art.

For this purpose, a first aspect of the invention relates to an output buffer register which comprises:
- a first flip-flop register comprising a given number N of flip-flops each having a data input, a data output and an enable input;
- a second flip-flop register comprising N flip-flops, each having a data input, a data output and an enable input;
- a third flip-flop register comprising a flip-flop having a data input, a data output and an enable input; and
- an output multiplexer having N first inputs, N second inputs, N outputs and a selection input.

The enable inputs of the flip-flops of the first, second, and third registers receive one and the same clock signal. The data inputs of the N flip-flops of the first register respectively receive N input signals. The data outputs of the N flip-flops of the first register are respectively linked to the N first inputs of the output multiplexer. The N outputs of the output multiplexer deliver N respective output signals. The data inputs of the N flip-flops of the second register are respectively linked to the N outputs of the output multiplexer. The N data outputs of the N flip-flops of the second register are respectively linked to the N second inputs of the output multiplexer. The data input of the third register receives an enable signal. Finally, the data output of the third register is linked to the selection input of the output multiplexer.

The drawback of the output buffer register in accordance with the prior art that was mentioned in the introduction does not exist with the output buffer register according to the invention. Specifically, the enable signal enters on the data input of the third flip-flop only. The advantages of the invention as compared with the prior art are especially noticeable for high values of N (typically for N greater than 10).

Certainly, the output buffer register according to the invention requires 2N+1 flip-flops while that according to the prior art comprises only N. When N is large, this amounts to doubling the number of flip-flops, this having consequences on the area of silicon occupied by the output register.

Furthermore, the micro-structure of the output buffer register according to the invention does not comply with the design rule presented in the introduction, since the output signals are delivered by an output multiplexer. This introduces some latency at the output. Nevertheless, this latency is acceptable having regard to the gain in time at the input of the buffer register.

A second aspect of the invention relates to a method for delivering output signals with the aid of an output buffer register, the method comprising the steps of:
- applying a given number N of input signals to the data inputs of N respective flip-flops of a first flip-flop register comprising a given number N of flip-flops each having a data input, a data output and an enable input;
- linking the data outputs of the N flip-flops of the first register respectively to N first inputs of an output multiplexer having N first inputs, N second inputs, N outputs, and a selection input;
- linking the data inputs of N flip-flops of a second flip-flops register comprising N flip-flops each having a data input, a data output and an enable input, respectively to the N outputs of the output multiplexer which deliver N respective output signals;

linking the N data outputs of the N flip-flops of the second register respectively to the N second inputs of the output multiplexer;

linking the data output of a third flip-flop register comprising a flip-flop having a data input, a data output and an enable input, to the selection input of the output multiplexer;

applying an enable signal to the data input; and applying one and the same clock signal to the enable inputs of the flip-flops of the first, second and third registers.

Finally, a third aspect of the invention relates to an electronic system comprising a system bus and at least one system module connected to the system bus by way of an appropriate communication port. The system module comprises an output buffer register according to the first aspect of the invention, which is arranged upstream of the communication port. According to an embodiment of the present invention, an integrated circuit can include an output buffer register, according to the first aspect of the invention, and thereby provide the significant benefits of the present invention.

BRIEF DESCRIPTION OF THE DRAWING

Other characteristics and advantages of the invention will become further apparent on reading the description that follows. The latter is purely illustrative and should be read in conjunction with the appended drawings in which.

DESCRIPTION OF THE PREFERRED EMBODIMENTS

Figure 1:
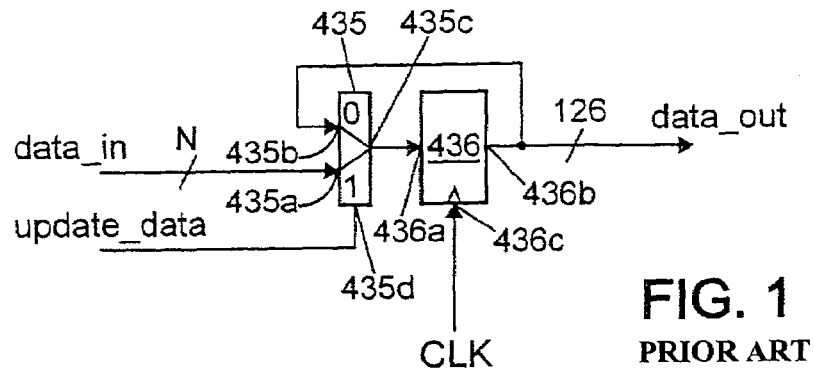
FIG. 1 is a diagram of a buffer register according to the prior art.
Figure 2:
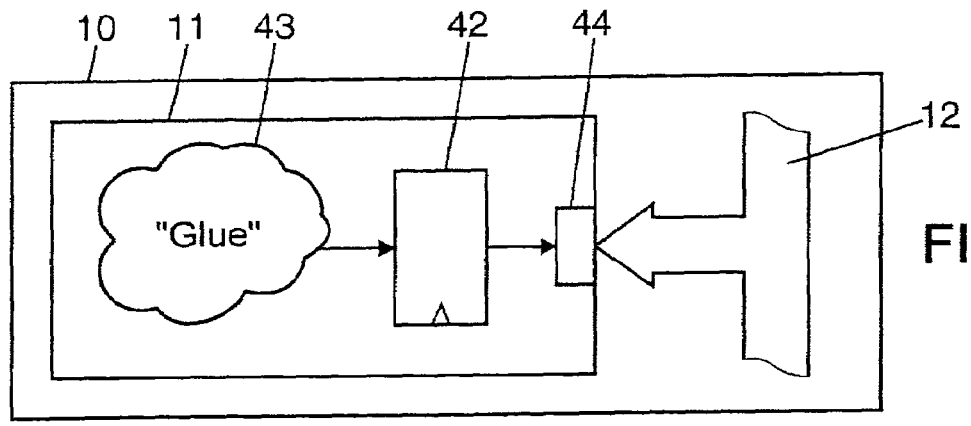
FIG. 2 is a schematic diagram of an exemplary electronic system according to the invention.

In FIG. 2, an electronic system 10, such as a microprocessor, comprises a system bus 12 and at least one system module 11.

The system module is linked to the system bus 12 by way of an appropriate communication port 44, such as a master port. Such a system module can be a microprocessor core, an interface for accessing to resources external to the microprocessor (in particular memories), or any other functional module, or the like.

In one example, the system module 11 comprises elements forming a combinatorial logic unit 43 (known as "glue" in the jargon of the person skilled in the art), and an output buffer circuit 42 arranged downstream of the logic unit 43 and upstream of the port 44. This circuit 42 has the function of delivering output signals emanating from the logic unit 43, so that they are transmitted on the bus 12. Instead of the logic unit 43, it is possible to envision any other element or any combination of elements performing a function of the system module 11.

For the sake of generality, the output buffer register 42 is considered to transmit a given number N of signals. Preferably, N is greater than 10. In one example, N is equal to 126.

FIG. 2 shows an exemplary embodiment of an output buffer register 42 according to the invention. The register 42 comprises three registers with flip-flops and an output multiplexer.

The register 42 thus comprises a first flip-flops register 431 or data input register. The register 431 comprises N flip-flops each having a data input, a data output and an enable input. The N data inputs 431a of the N flip-flops respectively receive N input signals data_in. The N data outputs 431b of the N flip-flops are linked to N first respective inputs 434a of an output multiplexer 434, having N first inputs 434a, N second inputs 434b, N outputs 434c and a selection input 434d. The N outputs 434c of the output multiplexer 434 deliver N output signals data_out.

The register 42 further comprises a second flip-flops register 432 or latching register. The register 432 also has N flip-flops, each having a data input, a data output and an enable input. The N data inputs 432a of the N flip-flops of the register 432 are respectively linked to the N outputs 434b of the output multiplexer 434, so as respectively to receive the N output signals. Further, the N data outputs of the flip-flops of the register 432 are respectively linked to the N second inputs of the output multiplexer 434.

The register 42 further comprises a third flip-flop register 433 or enable register. The register 433 comprises a flip-flop that has a data input 433a, a data output 433b and an enable input 433c. The data input 433a receives the update_data enable signal delivered by a state machine forming part of a combinatorial logic unit 43. The data output 433b is linked to the selection input of the output multiplexer 434.

The enable inputs 431c, 432c and 433c of the respective flip-flops of the registers 431, 432 and 433, respectively receive the signal CLK, that is the system clock signal.

Figure 3:
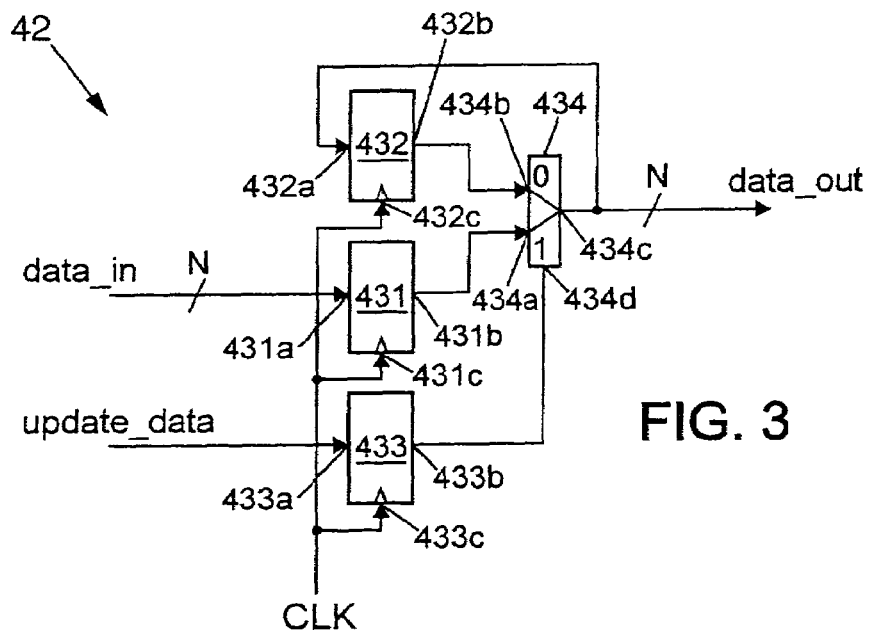
FIG. 3 is a diagram of an exemplary embodiment of an output buffer register according to the invention.

The manner of operation of the output buffer register 42 of FIG. 3 is as follows.

Let us assume that at a given instant, the update_data signal switches from 0 to 1. At the next clock pulse, the value 1 is stored in the enable register 433. Further, the current values of the N input signals are stored in the input register 432. The N first inputs 434a of the output multiplexer 434 are selected by the signal delivered by the data output 433b of the register 433. Consequently, the current values of the N input signals are delivered by the N outputs 434c of the multiplexer 434 as the N output signals, this being so irrespective of the previous values of the output signals, which were stored in the register 432. At the next clock pulse, the new values of the N output signals are stored in the latching register 432.

Let us now assume that the update_data signal switches back to 0. At the next clock pulse, the value 0 is stored in the enable register 433. The second inputs 434b of the multiplexer 434 are therefore selected. Consequently, the values of the N output signals, which were previously stored in the latching register 432, are delivered by the N outputs of the multiplexer 434 as the N output signals, this being so irrespective of the (possibly new) values of the N input signals. Stated otherwise, the values of the N output signals are latched by the latching register 432.

In one exemplary embodiment, the flip-flops are D type flip-flops.

The present invention is not limited to the examples described above. Many alternative embodiments are possible without departing from the scope defined by the appended claims. For example, it should be obvious to those of ordinary skill in the art in view of the present discussion that alternative embodiments of the new and novel output buffer circuit may be implemented in an integrated circuit comprising a circuit supporting substrate that supports at least a portion of the new and novel output buffer circuit discussed above. Additionally, the new and novel integrated circuit may be implemented in a computer system comprising at least one integrated circuit thereby providing the advantages of the present invention to such computer system.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An output buffer register comprising:
   a first flip-flop register comprising a given number N of flip-flops each having a data input, a data output, and an enable input;
   a second flip-flop register comprising N flip-flops, each having a data input, a data output, and an enable input;
   a third flip-flop register comprising a flip-flop having a data input, a data output, and an enable input; and
   an output multiplexer having N first inputs, N second inputs, N outputs and a selection input, and wherein
      the enable inputs of the flip-flops of the first, second, and third registers, receive one and the same clock signal;
      the data inputs of the N flip-flops of the first register respectively receive N input signals;
      the data outputs of the N flip-flops of the first register are respectively linked to the the N first inputs of the output multiplexer;
      the N outputs of the output multiplexer deliver N respective output signals;
      the data inputs of the N flip-flops of the second register are respectively linked to the N outputs of the output multiplexer;
      the N data outputs of the N flip-flops of the second register are respectively linked to the N second inputs of the output multiplexer;
      the data input of the third register receives an enable signal; and
      the data output of the third register is linked to the selection input of the output multiplexer.

2. The output buffer register according to claim 1, wherein N is greater than 10.

3. The output buffer register according to claim 1, wherein the flip-flops are D type flip-flops.

4. A method for delivering output signals with the aid of an output buffer register, the method comprises the steps:
   applying a given number N of input signals to the data inputs of N respective flip-flops of a first flip-flop register comprising a given number N of flip-flops each having a data input, a data output, and an enable input;
   linking the data outputs of the N flip-flops of the first flip-flop register, respectively, to N first inputs of an output multiplexer having N first inputs, N second inputs, N outputs, and a selection input;
   linking the data inputs of N flip-flops of a second flip-flop register comprising N flip-flops each having a data input, a data output, and an enable input, respectively, to the N outputs of the output multiplexer which deliver N respective output signals;
   linking the N data outputs of the N flip-flops of the second register, respectively, to the N second inputs of the output multiplexer;
   linking the data output of a third flip-flop register comprising a flip-flop having a data input, a data output and an enable input, to the selection input of the output multiplexer;
   applying an enable signal to the data input; and
   applying one and the same clock signal to the enable inputs of the flip-flops of the first, second and third registers.

5. The method according to claim 4, wherein N is greater than 10.

6. The method according to claim 4, wherein the flip-flops are D type flip-flops.

7. An electronic system comprising:
   a system bus; and
   at least one system module connected to the system bus by way of an appropriate communication port, wherein the system module comprises an output buffer register arranged upstream of the communication port, the output buffer register comprising:
   a first flip-flop register comprising a given number N of flip-flops each having a data input, a data output, and an enable input;
   a second flip-flop register comprising N flip-flops, each having a data input, a data output, and an enable input;
   a third flip-flop register comprising a flip-flop having a data input, a data output, and an enable input; and
   an output multiplexer having N first inputs, N second inputs, N outputs and a selection input, and wherein
      the enable inputs of the flip-flops of the first, second, and third registers, receive one and the same clock signal;
      the data inputs of the N flip-flops of the first register respectively receive N input signals;
      the data outputs of the N flip-flops of the first register are respectively linked to the the N first inputs of the output multiplexer;
      the N outputs of the output multiplexer deliver N respective output signals;
      the data inputs of the N flip-flops of the second register are respectively linked to the N outputs of the output multiplexer;
      the N data outputs of the N flip-flops of the second register are respectively linked to the N second inputs of the output multiplexer;
      the data input of the third register receives an enable signal; and
      the data output of the third register is linked to the selection input of the output multiplexer.

8. The electronic system according to claim 7, wherein N is greater than 10.

9. The electronic system according to claim 7, wherein the flip-flops are D type flip-flops.

10. An integrated circuit comprising:
    a circuit supporting substrate; and
    at least one output buffer at least partly disposed on the circuit supporting substrate, wherein the at least one output buffer comprises:
       an output buffer register arranged upstream of the communication port, the output buffer register comprising:

a first flip-flop register comprising a given number N of flip-flops each having a data input, a data output, and an enable input;

a second flip-flop register comprising N flip-flops, each having a data input, a data output, and an enable input;

a third flip-flop register comprising a flip-flop having a data input, a data output, and an enable input; and an output multiplexer having N first inputs, N second inputs, N outputs and a selection input, and wherein the enable inputs of the flip-flops of the first, second, and third registers, receive one and the same clock signal;

the data inputs of the N flip-flops of the first register respectively receive N input signals;

the data outputs of the N flip-flops of the first register are respectively linked to the the N first inputs of the output multiplexer;

the N outputs of the output multiplexer deliver N respective output signals;

the data inputs of the N flip-flops of the second register are respectively linked to the N outputs of the output multiplexer;

the N data outputs of the N flip-flops of the second register are respectively linked to the N second inputs of the output multiplexer;

the data input of the third register receives an enable signal; and the data output of the third register is linked to the selection input of the output multiplexer.

11. The integrated circuit according to claim 10, wherein N is greater than 10.

12. The integrated circuit according to claim 10, wherein the flip-flops are D type flip-flops.

* * * * *